(12) United States Patent
Melichar

(10) Patent No.: US 7,209,841 B2
(45) Date of Patent: Apr. 24, 2007

(54) MAXIMUM AND MINIMUM POWER LIMIT CALCULATOR FOR BATTERIES AND BATTERY SUBPACKS

(75) Inventor: Robert J Melichar, Troy, MI (US)

(73) Assignee: Cobasys, LLC, Orion, MI (US)

( * ) Notice: Subject to any disclaimer, the term of this patent is extended or adjusted under 35 U.S.C. 154(b) by 16 days.

(21) Appl. No.: 10/989,178

(22) Filed: Nov. 15, 2004

(65) Prior Publication Data

US 2006/0106553 A1 May 18, 2006

(51) Int. Cl.
*H02J 1/04* (2006.01)

(52) U.S. Cl. ........................ 702/63; 324/426; 324/427; 320/136

(58) Field of Classification Search .................... None
See application file for complete search history.

(56) References Cited

U.S. PATENT DOCUMENTS

| | | | | |
|---|---|---|---|---|
| 4,394,741 A | * | 7/1983 | Lowndes | 340/825.52 |
| 4,558,281 A | * | 12/1985 | Codd et al. | 324/433 |
| 4,876,513 A | * | 10/1989 | Brilmyer et al. | 324/427 |
| 5,119,011 A | * | 6/1992 | Lambert | 320/136 |
| 5,295,078 A | * | 3/1994 | Stich et al. | 700/297 |
| 5,321,627 A | * | 6/1994 | Reher | 702/63 |
| 5,412,323 A | | 5/1995 | Kato et al. | |
| 6,040,685 A | | 3/2000 | Tsenter et al. | |
| 6,160,380 A | | 12/2000 | Tsuji et al. | |
| 6,388,447 B1 | * | 5/2002 | Hall et al. | 324/426 |
| 6,417,668 B1 | * | 7/2002 | Howard et al. | 324/426 |

| | | | |
|---|---|---|---|
| 2002/0113594 A1 | | 8/2002 | Satake |
| 2003/0112011 A1 | | 6/2003 | Guitheen et al. |
| 2003/0169049 A1 | * | 9/2003 | Kawaguchi et al. ........ 324/426 |
| 2004/0155624 A1 | | 8/2004 | Masahiko et al. |

FOREIGN PATENT DOCUMENTS

| | | |
|---|---|---|
| DE | 101 47 565 A1 | 4/2003 |
| DE | 10147562 | 4/2003 |
| EP | 0 560 468 A | 9/1993 |
| EP | 1 085 592 A | 3/2001 |
| EP | 1 139 464 A2 | 10/2001 |
| EP | 1 220 413 A | 7/2002 |
| EP | 1 548 453 A | 6/2005 |
| GB | 2086060 A * | 5/1982 |
| WO | WO 2004/008166 | 1/2004 |

OTHER PUBLICATIONS

International Search Report dated Sep. 12, 2005 for Application No. PCT/US2005/011761; 6 pages.

* cited by examiner

*Primary Examiner*—Carol S. W. Tsai
(74) *Attorney, Agent, or Firm*—Harness, Dickey & Pierce, P.L.C.

(57) ABSTRACT

A system for determining an operating limit of at least one battery according to some embodiments of the present invention comprises a voltage module that measures a voltage V across at least one battery during first and second periods. A current sensor that measures current I supplied by the at least one battery during the first and second periods. A limit module estimates a sum of a polarization voltage $V_P$ and an open circuit voltage $V_O$ of the at least one battery at the second period based on the voltage V and current I of the at least one battery at the first period and an ohmic resistance $R_O$ of the at least one battery.

23 Claims, 6 Drawing Sheets

MAXIMUM AND MINIMUM POWER LIMIT CALCULATOR FOR BATTERIES AND BATTERY SUBPACKS

CROSS-REFERENCE TO RELATED APPLICATIONS

This application is related to U.S. patent application Ser. No. 10/989,159, filed Nov. 15, 2004, which is hereby incorporated by reference.

FIELD OF THE INVENTION

The present invention relates to batteries and battery systems, and more particularly to a maximum and minimum power limit calculator for batteries and battery systems.

BACKGROUND OF THE INVENTION

Battery systems may be used to provide power in a wide variety applications. Exemplary transportation applications include hybrid electric vehicles (HEV), electric vehicles (EV), Heavy Duty Vehicles (HDV) and Vehicles with 42-volt electrical systems. Exemplary stationary applications include backup power for telecommunications systems, uninterruptible power supplies (UPS), and distributed power generation applications. Examples of the types of batteries that are used include nickel metal hydride (NiMH) batteries, lead-acid batteries and other types of batteries. A battery system may include a plurality of battery subpacks that are connected in series and/or in parallel. The battery subpacks may include a plurality of batteries that are connected in parallel and/or in series.

The maximum and/or minimum power that can be delivered by batteries, battery subpacks and/or battery systems varies over time as a function of a temperature of the batteries, battery state of charge (SOC) and/or battery age. For example in transportation applications such as HEVs or EVs, it is important for the powertrain control system to know the maximum and/or minimum power limit of the battery system. The powertrain control system typically receives an input request for power from an accelerator pedal. The powertrain control system interprets the request for power relative to the maximum power limit of the battery system (when the battery system is powering the wheels). The minimum power limits may be relevant during recharging and/or regenerative braking. Exceeding the maximum and/or minimum power limits may damage the batteries and/or the battery system and/or reduce the operational life of the batteries and/or the battery system.

In addition, the demands of an application should not be suddenly clamped as the battery system reaches its maximum and/or minimum power limit. To provide smooth operation, the battery system should be able to predict the maximum and/or minimum power limits and communicate the power limits to the application.

SUMMARY OF THE INVENTION

A system for determining an operating limit of at least one battery according to some embodiments of the present invention comprises a voltage module that measures a voltage across at least one battery during first and second periods. A current sensor that measures current supplied by the at least one battery during the first and second periods. A limit module estimates a sum of a polarization voltage and an open circuit voltage of the at least one battery at the second period based on the voltage and current of the at least one battery at the first period and an ohmic resistance of the at least one battery.

In some implementations, the limit module calculates at least one of a maximum current limit and/or a minimum current limit for the at least one battery at the second period based on the sum, at least one of a maximum voltage limit and/or a minimum voltage limit, respectively, and the ohmic resistance of the at least one battery. The first period occurs before the second period. The limit module calculates at least one of a maximum power limit and a minimum power limit of the at least one battery based on the at least one of the maximum current limit and/or the minimum current limit, respectively, and the at least one of the maximum voltage limit and/or the minimum voltage limit, respectively.

In other implementations, a battery system comprises the system of claim 1 and further comprises the at least one battery. A battery subpack includes N−1 additional batteries connected in series with the at least one battery. M−1 additional battery subpacks connected in parallel with the battery subpack.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
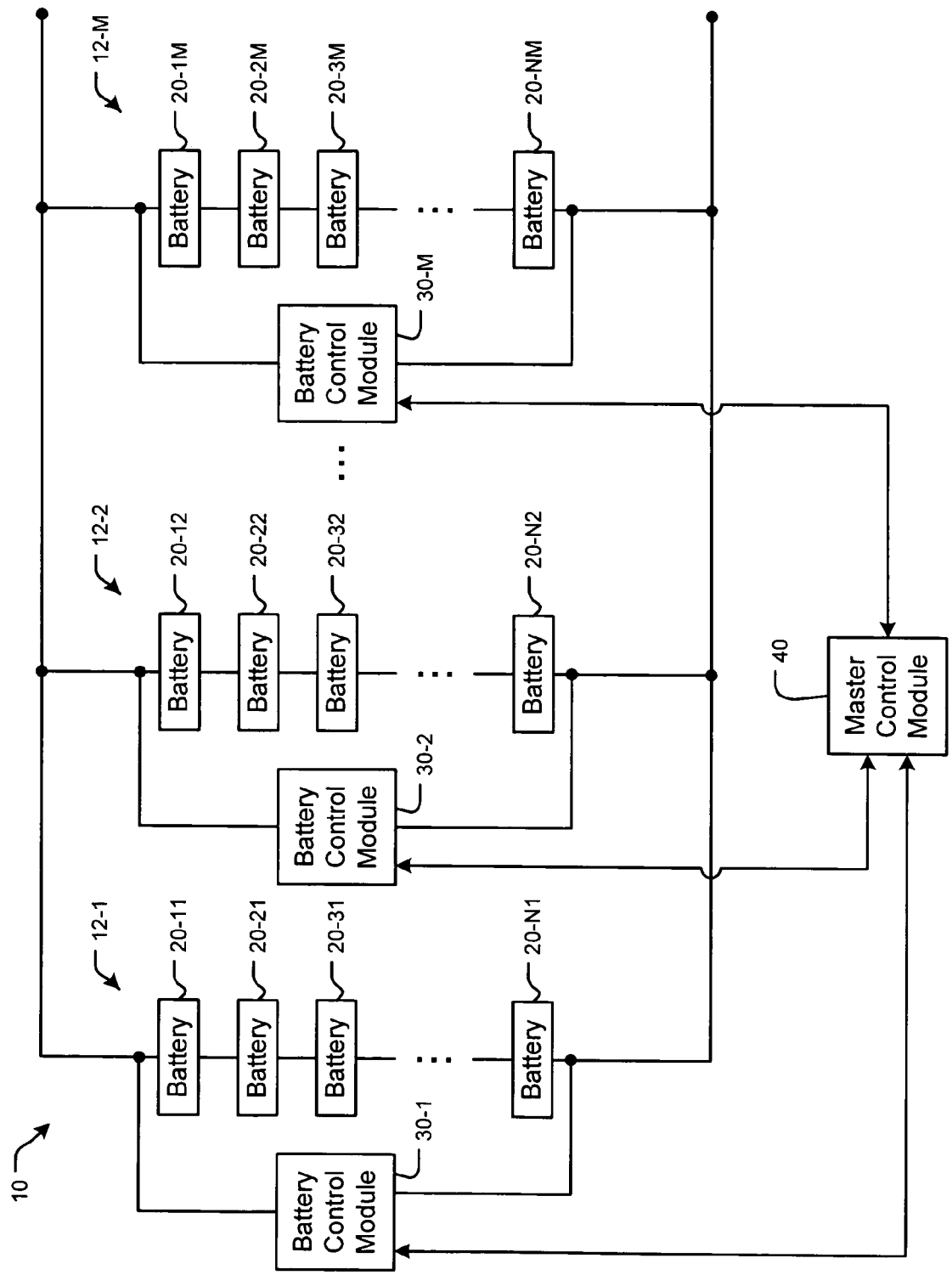
FIG. 1 is a functional block diagram of an exemplary battery system including battery subpacks with batteries, battery control modules and a master control module.

The following description of the preferred embodiment(s) is merely exemplary in nature and is in no way intended to limit the invention, its application, or uses. For purposes of clarity, the same reference numbers will be used in the drawings to identify the same elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Referring now to FIG. 1, an exemplary embodiment of a battery system 10 is shown to include M battery subpacks 12-1, 12-2, ..., and 12-M (collectively battery subpacks 12). The battery subpacks 12-1, 12-2, ..., and 12-M include N series connected batteries 20-11, 20-12, ..., and 20-NM (collectively batteries 20). Battery control modules 30-1, 30-2, ... and 30-M (collectively battery control modules 30) are associated with each of the battery subpacks 12-1, 12-2, ... and 12-M, respectively. In some embodiments, M is equal to 2 or 3, although additional or fewer subpacks may be used. In some embodiments, N is equal to 12-24, although additional and/or fewer batteries may be used.

The battery control modules 30 sense voltage across and current provided by the battery subpacks 12. Alternatively, the battery control modules 30 may monitor one or more individual batteries 20 in the battery subpacks 12 and appropriate scaling and/or adjustment is performed. The battery control modules 30 communicate with a master control module 40 using wireless and/or wired connections. The master control module 40 receives the power limits from the battery control modules 30 and generates a collective power limit. The battery control module 30 may be integrated with the master control module 40 in some embodiments.

Figure 2:
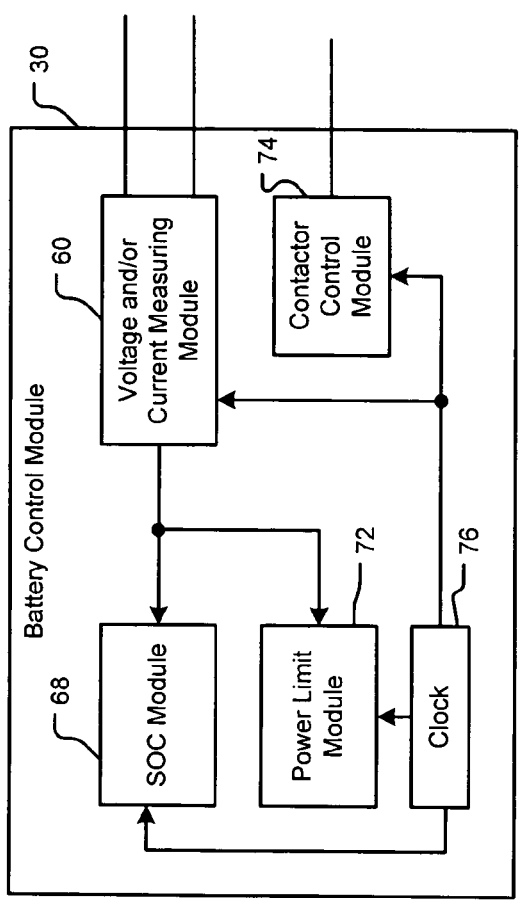
FIG. 2 is a functional block diagram of an exemplary battery control module.

Referring now to FIG. 2, some of the elements of the battery control modules 30 are shown. The battery control modules 30 include a voltage and/or current measuring module 60 that measures voltage across the battery subpack 12 and/or across one or more individual batteries 20 in the battery subpack 12. The battery control modules 30 further include a battery state of charge (SOC) module 68 that periodically calculates the SOC of the batteries 20 in the battery subpacks 12. A power limit module 72 calculates a maximum current limit $I_{lim}$, voltage limit $V_{lim}$, and/or power limit $P_{lim}$ for the battery subpack 12 and/or one or more batteries 20 in the battery subpack 12, as will be described further below. The limits may be maximum and/or minimum limits. A contactor control module 74 controls one or more contactors (not shown) that are associated with the control and/or connection of the batteries 20 in the battery subpacks 12. A clock circuit 76 generates one or more clock signals for one or more modules within the battery control module 30.

Figure 3:
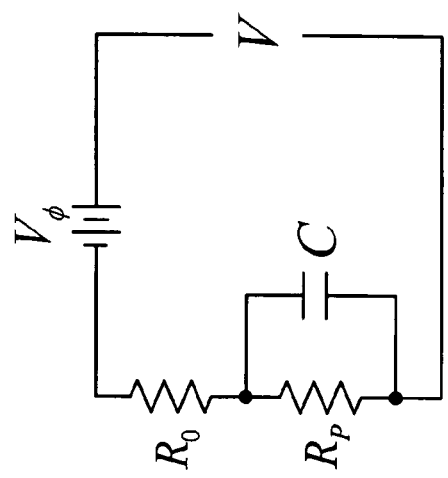
FIG. 3 is an electrical schematic of an equivalent circuit for an exemplary battery.

Referring now to FIG. 3, an equivalent circuit for the battery 20 is show where $R_0$ represents ohmic resistance of the battery, $V_P$ represents the polarization voltage, $V_0$ represents the open circuit voltage, I represents battery current and V represents battery voltage. V and I are measured values. $R_p$ varies with temperature, duration of applied current and SOC. $V_0$ and $R_0$ vary primarily with SOC. $V_P$ is equal to measured current I times $R_p$.

Using the equivalent circuit and Kirchoffs voltage rules for the battery 20, $V=V_0+V_P+IR_0$. By manipulating this equation, an equation for the open circuit voltage $V_0$ and polarization voltage $V_P$ is $V_0+V_P=V-IR_0$. The values of V and I are measured by the system and $R_0$ is estimated. Alternately, the system may perform a continuous calculation of $R_0$. In particular, $$R_0 = \frac{(V_i - V_{i-1})}{(I_i - I_{i-1})}$$

when performed on reversal of current.

In one embodiment, the maximum voltage $V_{max}$ of the system is known and $V_{max}=V_0+V_P+I_{max}R_0$. Substitution of the calculation for $V_0+V_P$ from a prior sampling interval into the equation for $V_{max}$ yields $V_{max}=(V-IR_o)+I_{max}R_o$. In this case, we are assuming that $V_0+V_P$ for the current sampling interval is approximately equal to $V_0+V_P$ of the prior sampling interval (in other words, $V_0+V_P \cong V_{t=i-1}-I_{t=i-1}R_0$). This approximation is valid if the sampling interval is sufficiently small since the battery and ambient conditions are very similar. For example in some implementations, a sampling interval 10 ms<T<500 ms may be used, although other sampling intervals may be used. In one embodiment, T=100 ms. If the sampling interval is determined to be excessive in duration then $R_o$ would be increased as a constant or as a temperature dependent variable.

Solving for $I_{max}$ yields the following:

$$I_{max} = \frac{V_{max} - V_{t=i-1} + I_{t=i-1}R_0}{R_0}.$$

Therefore, since $P_{max}=V_{max}I_{max}$, $$P_{max} = V_{max}\left(\frac{V_{max} - V_{t=i-1} + I_{t=i-1}R_0}{R_0}\right).$$

Figure 4:
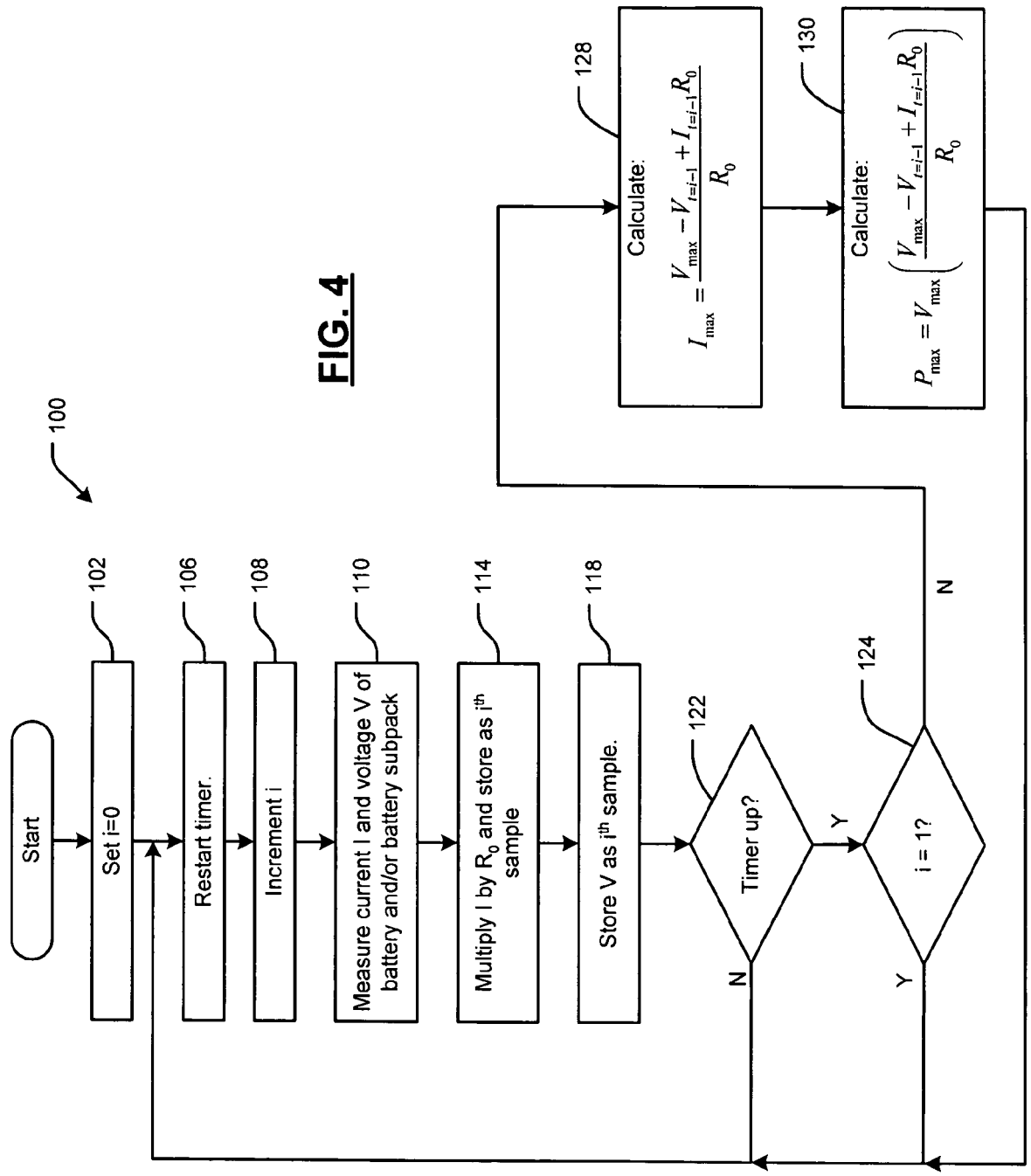
FIG. 4 is an exemplary flowchart illustrating steps for generating a maximum power limit for the battery system of FIG. 1 when $V_{max}$ is known.

Referring now to FIG. 4, a method 100 for calculating $P_{max}$ is shown. In step 102, i is set equal to 0. In step 106, a timer is reset. In step 108, i is incremented. In step 110, current I and voltage V of one or more batteries 20 and/or the battery subpack 12 are measured. In step 114, I is multiplied by $R_0$ and stored as the $i^{th}$ sample. In step 118, V is stored as the $i^{th}$ sample. In step 122, control determines whether the timer is up. If step 122 is false, control returns to step 106. If step 122 is true, control continues with step 124 and determines whether i=1. If step 124 is true, control returns to step 106. If step 124 is false, control continues with step 128 and calculates $I_{max}$. Control continues with step 130 and calculates $P_{max}$ and then returns to step 106.

Additional processing may be performed depending upon the configuration. For example, if V and I are sensed for each battery and there are N batteries are in series, then the $P_{max}$ and other calculations can be scaled. Other calculations will occur if the N batteries are connected in another fashion. The $P_{max}$ calculation and other calculations can also be made at other intervals, on demand, when an event occurs, randomly, and/or using any other criteria.

Systems that specify $V_{max}$ also typically specify $V_{min}$, which yields the following relationships using a similar approach:

$$I_{min} = \frac{V_{min} - V_{t=i-1} + I_{t=i-1}R_0}{R_0}.$$

Therefore, since $P_{min}=V_{min}I_{min}$, $$P_{min} = V_{min}\left(\frac{V_{min} - V_{t=i-1} + I_{t=i-1}R_0}{R_0}\right).$$

Figure 5:
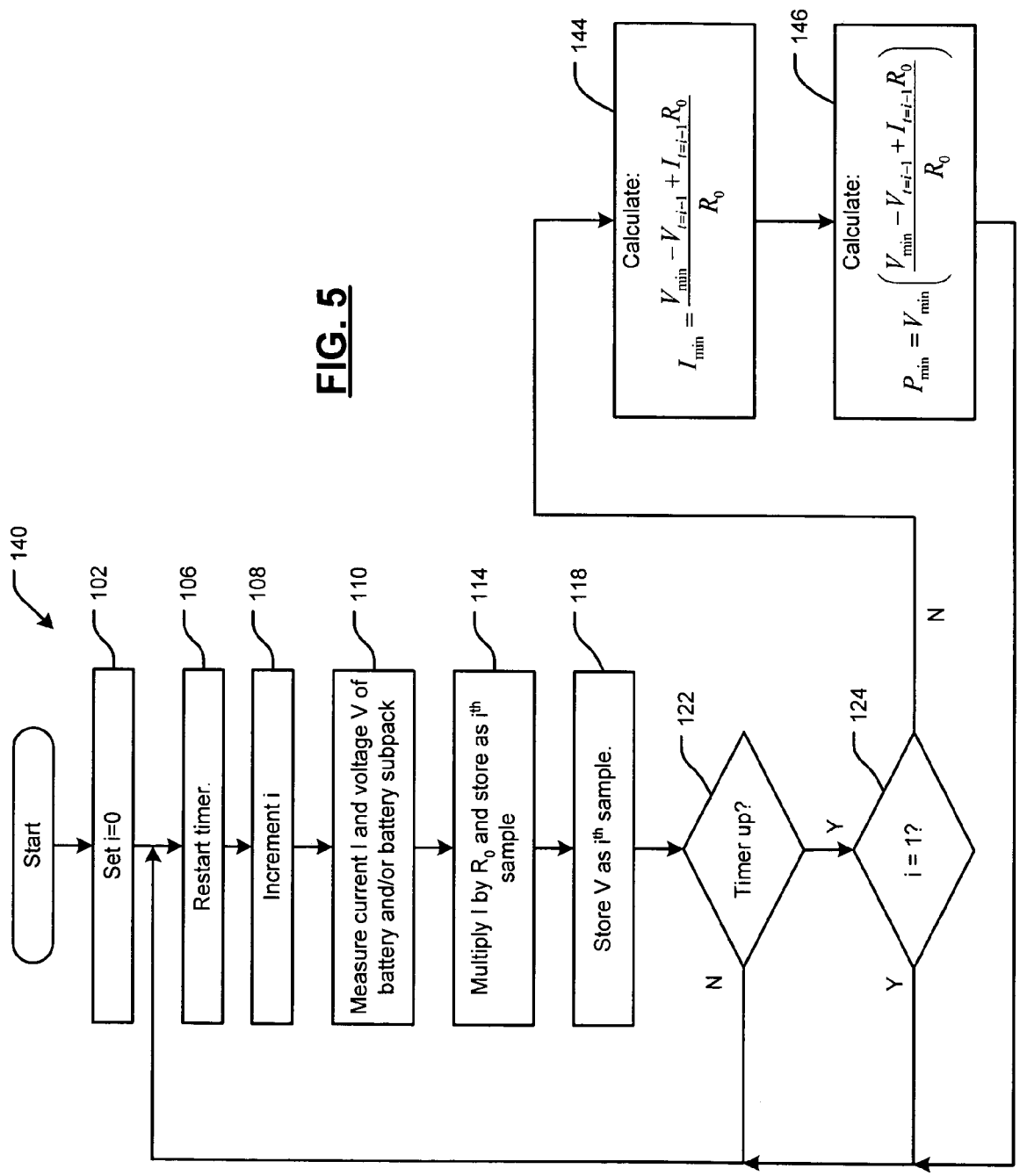
FIG. 5 is an exemplary flowchart illustrating steps for generating a minimum power limit for the battery system of FIG. 1 when $V_{min}$ is known.

Referring now to FIG. 5, a method 140 for calculating $V_{min}$ is shown. If step 124 is false, control continues with step 144 and calculates $I_{min}$ and with step 146 and calculates $P_{min}$. As can be appreciated, steps 144 and 146 can be added to the method 100 in FIG. 4 so that $I_{max}$ and $P_{max}$ and/or $I_{min}$ and $P_{min}$ can be calculated.

Alternately for systems having a known $I_{lim}$ and using a similar approach, $$V_{max}=I_{max}R_0+V_{t=i-1}-I_{t=i-1}R_0.$$

Therefore, since $P_{max}=V_{max}I_{max}$, $$P_{max}=I_{max}(I_{max}R_0+V_{t=i-1}-I_{t=i-1}R_0).$$

Figure 6:
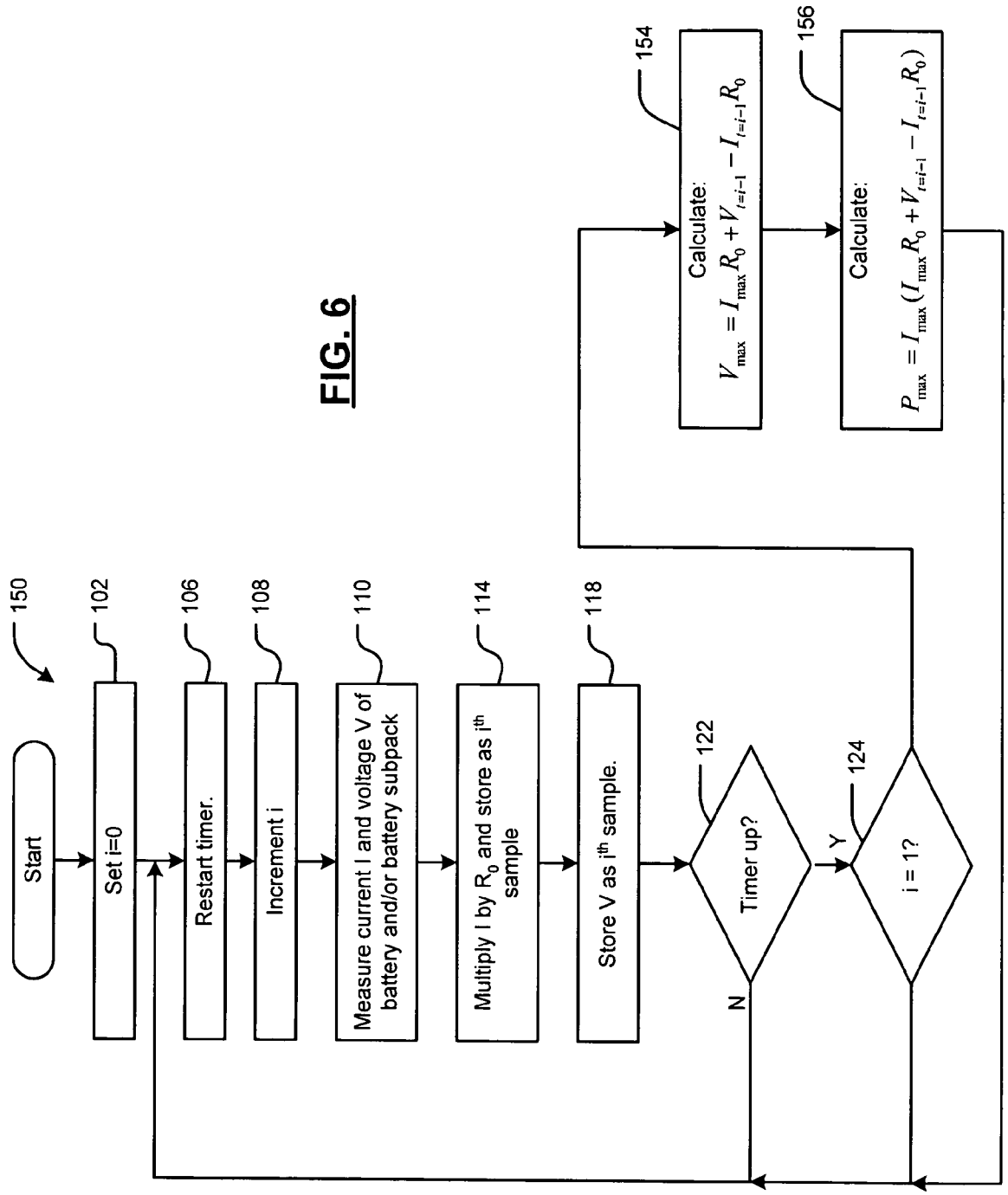
FIG. 6 is an exemplary flowchart illustrating steps for generating a maximum power limit for the battery system of FIG. 1 when $I_{max}$ is known.

Referring now to FIG. 6, a method 150 for calculating $I_{max}$ is shown. If step 124 is false, control continues with step 154 and calculates $I_{max}$ and with step 156 and calculates $P_{max}$.

Systems that specify $I_{max}$ also typically specify $I_{min}$, which yields the following relationships using a similar approach:

$$V_{min}=I_{min}R_0+V_{t=i-1}-I_{t=i-1}R_0.$$

Therefore, since $P_{min}=V_{min}I_{min}$, $$P_{min}=I_{min}(I_{min}R_0+V_{t=i-1}-I_{t=i-1}R_0).$$

Figure 7:
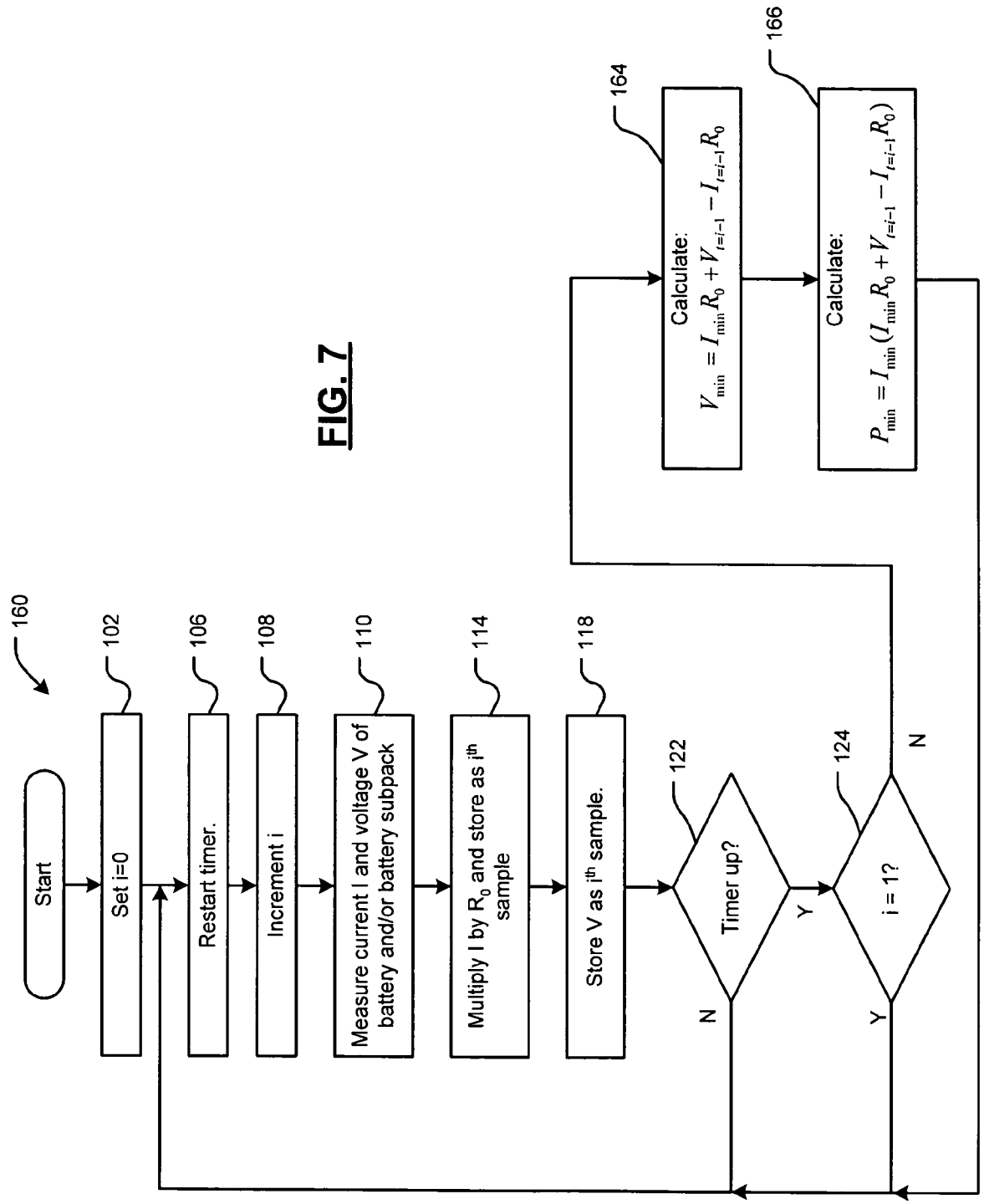
FIG. 7 is an exemplary flowchart illustrating steps for generating a minimum power limit for the battery system of FIG. 1 when $I_{min}$ is known.

Referring now to FIG. 7, a method 160 for calculating $I_{min}$ is shown. If step 124 is false, control continues with step 164 and calculates $I_{min}$ and with step 166 and calculates $P_{min}$. As can be appreciated, steps 164 and 166 can be added to the method 150 in FIG. 6 so that $I_{max}$ and $P_{max}$ and/or $I_{min}$ and $P_{min}$ can be calculated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A system for determining an operating limit of at least one battery, comprising:
   a voltage module that measures a voltage V across at least one battery during first and second periods;
   a current sensor that measures current I supplied by the at least one battery during said first and second periods; and
   a limit module that estimates a sum of a polarization voltage $V_P$ and an open circuit voltage $V_0$ of the at least one battery at said second period based on said voltage V and current I of the at least one battery at said first period and an ohmic resistance $R_0$ of the at least one battery and wherein said limit module calculates at least one of a maximum current limit $I_{max}$ and/or a minimum current $I_{min}$ limit for the at least one battery at said second period based on said sum, at least one of a maximum voltage limit $V_{max}$ and/or a minimum voltage limit $V_{min}$, respectively, and said ohmic resistance $R_0$ of the at least one battery.

2. The system of claim 1 wherein said first period occurs before said second period.

3. The system of claim 1 wherein said limit module calculates at least one of a maximum power limit and a minimum power limit of the at least one battery based on said at least one of said maximum current limit $I_{max}$ and/or said minimum current $I_{min}$ limit, respectively, and said at least one of said maximum voltage limit $V_{max}$ and/or said minimum voltage limit $V_{min}$, respectively.

4. A battery system comprising said system of claim 1 and further comprising said at least one battery.

5. The battery system of claim 4 further comprising a battery subpack including N−1 additional batteries connected in series with said at least one battery.

6. The battery system of claim 5 further comprising M−1 additional battery subpacks connected in parallel with said battery subpack.

7. A system for determining an operating limit of a battery, comprising:
   a voltage module that measures voltage V across at least one battery at first and second periods;
   a current sensor that measures current I supplied by the at least one battery at said first and second periods; and
   a limit module that estimates a sum of a polarization voltage $V_P$ and an open circuit voltage $V_0$ of the at least one battery at said second period based on said voltage V and current I of the at least one battery at said first period and an ohmic resistance $R_0$ of the at least one battery and wherein said limit module calculates at least one of a maximum voltage limit $V_{max}$ and/or a minimum voltage limit $V_{min}$ for the at least one battery at said second period based on said sum, at least one of a maximum current limit $I_{max}$ and/or a minimum current $I_{min}$ limit, respectively, and an ohmic resistance $R_0$ of the at least one battery.

8. The system of claim 7 wherein said first period occurs before said second period.

9. The system of claim 7 wherein said limit module calculates at least one of a maximum power limit and a minimum power limit of the at least one battery based on said at least one of said maximum current limit $I_{max}$ and/or said minimum current $I_{min}$ limit, respectively, and said at least one of said maximum voltage limit $V_{max}$ and/or said minimum voltage limit $V_{min}$, respectively.

10. A battery system comprising said system of claim 7 and further comprising said at least one battery.

11. The battery system of claim 10 further comprising a battery subpack including N−1 additional batteries connected in series with said at least one battery.

12. The battery system of claim 11 further comprising M−1 additional battery subpacks connected in parallel with said battery subpack.

13. A method for determining an operating limit of a battery, comprising:
   sampling voltage V across at least one battery at first and second periods;
   sampling current I supplied by the at least one battery at said first and second periods;
   estimating a sum of a polarization voltage $V_P$ and an open circuit voltage $V_0$ of the at least one battery at said second period based on said voltaae V and current I of the at least one battery at said first period; and
   calculating at least one of a maximum voltage limit $V_{max}$ and/or a minimum voltage limit $V_{min}$ for the at least one battery at said second period based on said sum, at least one of a maximum current limit $I_{max}$ and/or a minimum current $I_{min}$ limit, respectively, and an ohmic resistance $R_0$ of the at least one battery.

14. The method of claim 13 wherein said first period occurs before said second period.

15. The method of claim 13 further comprising calculating at least one of a maximum power limit and a minimum power limit of the at least one battery based on said at least one of said maximum current limit $I_{max}$ and/or said minimum current $I_{min}$ limit, respectively, and said at least one of said maximum voltage limit $V_{max}$ and/or said minimum voltage limit $V_{min}$, respectively.

16. The method of claim 13 further comprising connecting N−1 additional batteries in series with said at least one battery to form a battery subpack.

17. The method of claim 16 further comprising connecting M−1 additional battery subpacks in parallel with said battery subpack.

18. A method for determining an operating limit of a battery, comprising:
   sampling voltage V across at least one battery at first and second periods;
   sampling current I supplied by the at least one battery at said first and second periods;
   estimating a sum of a polarization voltage $V_P$ and an open circuit voltage $V_O$ of the at least one battery at said second period based on said voltaae V and current I of the at least one battery at said first period; and
   calculating at least one of a maximum current limit $I_{max}$ and/or a minimum current $I_{min}$ limit for the at least one battery at said second period based on said sum, at least one of a maximum voltage limit $V_{max}$ and/or a minimum voltage limit $V_{min}$, respectively, and an ohmic resistance $R_O$ of the at least one battery.

19. The method of claim 18 wherein said first period occurs before said second period.

20. The method of claim 18 further comprising calculating at least one of a maximum power limit and a minimum power limit of the at least one battery based on said at least one of said maximum current limit $I_{max}$ and/or said minimum current $I_{min}$ limit, respectively, and said at least one of said maximum voltage limit $V_{max}$ and/or said minimum voltage limit $V_{min}$, respectively.

21. The method of claim 18 further comprising connecting N−1 additional batteries connected in series with said at least one battery to form battery subpack.

22. The method of claim 21 further comprising connecting M−1 additional battery subpacks in parallel with said battery subpack.

23. A method for determining an operating limit of a battery, comprising:
   sampling voltage V across the battery;
   sampling current I through the battery;
   estimating a sum of a polarization voltage $V_P$ and an open circuit voltage $V_O$ of the battery based on said voltage V and current I; and
   determining at least one of a maximum power limit $P_{max}$ and a minimum power limit $P_{min}$ for the battery based on said sum, an ohmic resistance $R_O$ of the battery, and at least one of a maximum voltage limit $V_{max}$, a maximum current limit $I_{max}$, a minimum current $I_{min}$ limit, and a minimum voltage limit $V_{min}$ of the battery.

* * * * *